US012808038B2

(12) United States Patent
Onodera et al.

(10) Patent No.: US 12,808,038 B2
(45) Date of Patent: Nov. 24, 2026

(54) FILM FORMING METHOD AND FILM FORMING APPARATUS

(71) Applicant: Tokyo Electron Limited, Tokyo (JP)

(72) Inventors: Satoshi Onodera, Yamanashi (JP); Yamato Tonegawa, Yamanashi (JP); Jun Ogawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 149 days.

(21) Appl. No.: 18/518,810

(22) Filed: Nov. 24, 2023

(65) Prior Publication Data

US 2024/0175122 A1 May 30, 2024

(30) Foreign Application Priority Data

Nov. 28, 2022 (JP) ................................ 2022-189358

(51) Int. Cl.
*C23C 16/36* (2006.01)
*C23C 16/56* (2006.01)

(52) U.S. Cl.
CPC ............. *C23C 16/36* (2013.01); *C23C 16/56* (2013.01)

(58) Field of Classification Search
None
See application file for complete search history.

(56) References Cited

U.S. PATENT DOCUMENTS

| | | | | |
|---|---|---|---|---|
| 2018/0119276 | A1* | 5/2018 | Lei | C23C 16/45553 |
| 2018/0337031 | A1* | 11/2018 | Hashimoto | C23C 16/36 |
| 2020/0294798 | A1* | 9/2020 | Wagatsuma | H01L 21/02326 |

FOREIGN PATENT DOCUMENTS

| | | |
|---|---|---|
| JP | 2005-012168 | 1/2005 |
| JP | 2022-065560 | 4/2022 |

* cited by examiner

*Primary Examiner* — Mandy C Louie
(74) *Attorney, Agent, or Firm* — IPUSA, PLLC

(57) ABSTRACT

A film forming method includes a) supplying raw material gas to a substrate, thereby adsorbing the raw material gas to the substrate, the raw material gas having, in a molecule thereof, a cyclic structure including a silicon atom and a carbon atom, b) thermally treating the substrate in an atmosphere including nitriding gas, thereby thermally nitriding the raw material gas adsorbed to the substrate, and c) exposing the substrate to a hydrogen plasma, thereby reforming the thermally nitrided raw material gas.

6 Claims, 11 Drawing Sheets

FILM FORMING METHOD AND FILM FORMING APPARATUS

CROSS-REFERENCE TO RELATED APPLICATIONS

This application is based upon and claims priority to Japanese Patent Application No. 2022-189358, filed on Nov. 28, 2022, the entire contents of which are incorporated herein by reference.

BACKGROUND

1. Field of the Invention

The present disclosure relates to film forming methods and film forming apparatuses.

2. Description of the Related Art

In, for example, Japanese Laid-Open Patent Publication No. 2005-12168, a technique of forming a silicon nitride film by using ammonia gas, silane-based gas, and hydrocarbon gas with the silane-based gas being intermittently supplied is known.

SUMMARY

According to one aspect of the present disclosure, a film forming method includes a) supplying raw material gas to a substrate, thereby adsorbing the raw material gas to the substrate, the raw material gas having, in a molecule thereof, a cyclic structure including a silicon atom and a carbon atom, b) thermally treating the substrate in an atmosphere including nitriding gas, thereby thermally nitriding the raw material gas adsorbed to the substrate, and c) exposing the substrate to a hydrogen plasma, thereby reforming the thermally nitrided raw material gas.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

The present disclosure provides a technique capable of forming a SiCN film that is not prone to oxidation.

Hereinafter, non-limiting embodiments of the present disclosure will be described with reference to the attached drawings. Throughout the attached drawings, the same or corresponding members or parts are designated by the same or corresponding reference symbols, and duplicate description thereof will be omitted.

[Film Forming Method]

Figure 1:
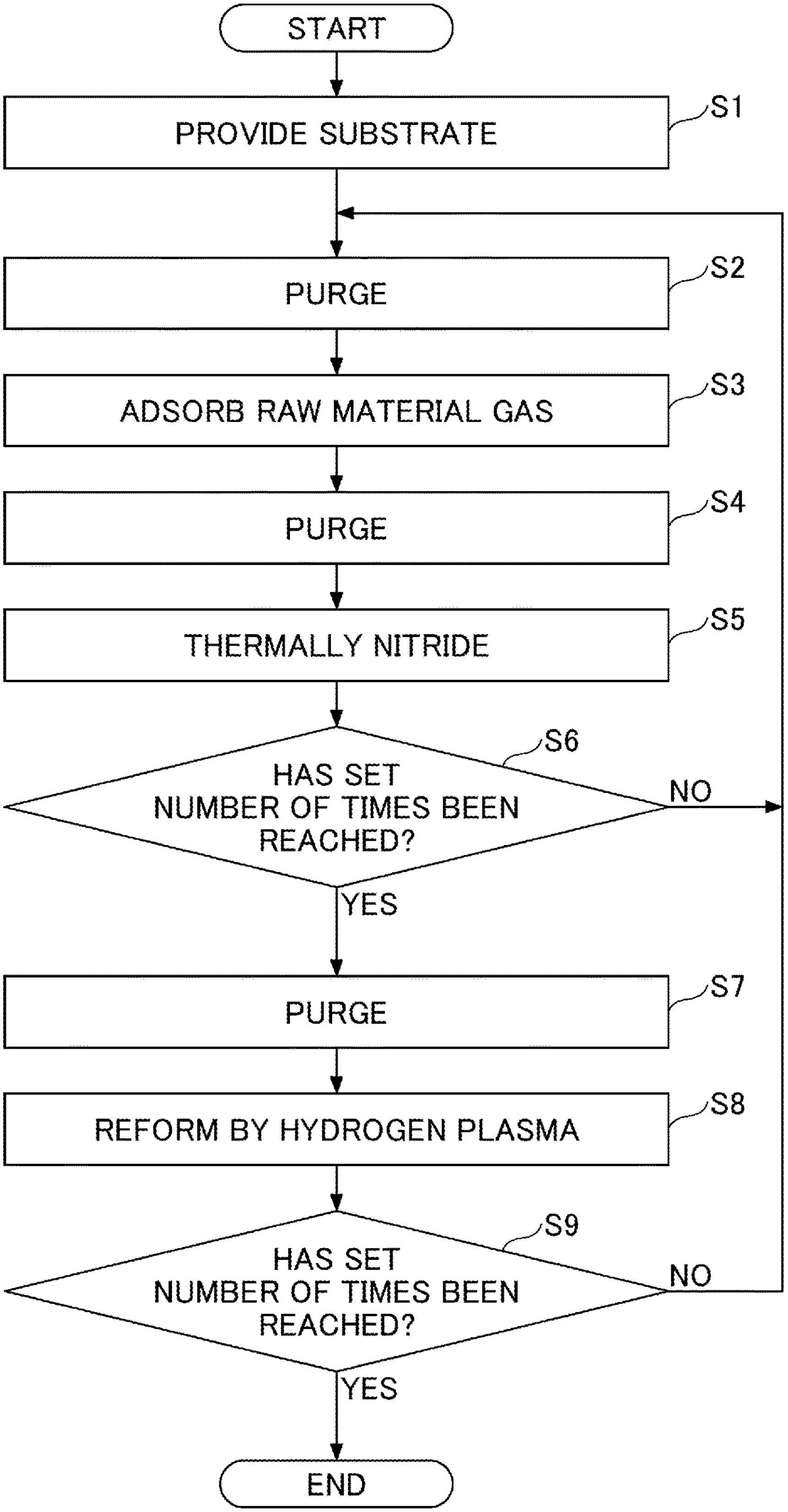
FIG. 1 is a flowchart illustrating a film forming method according to an embodiment.
Figure 2:
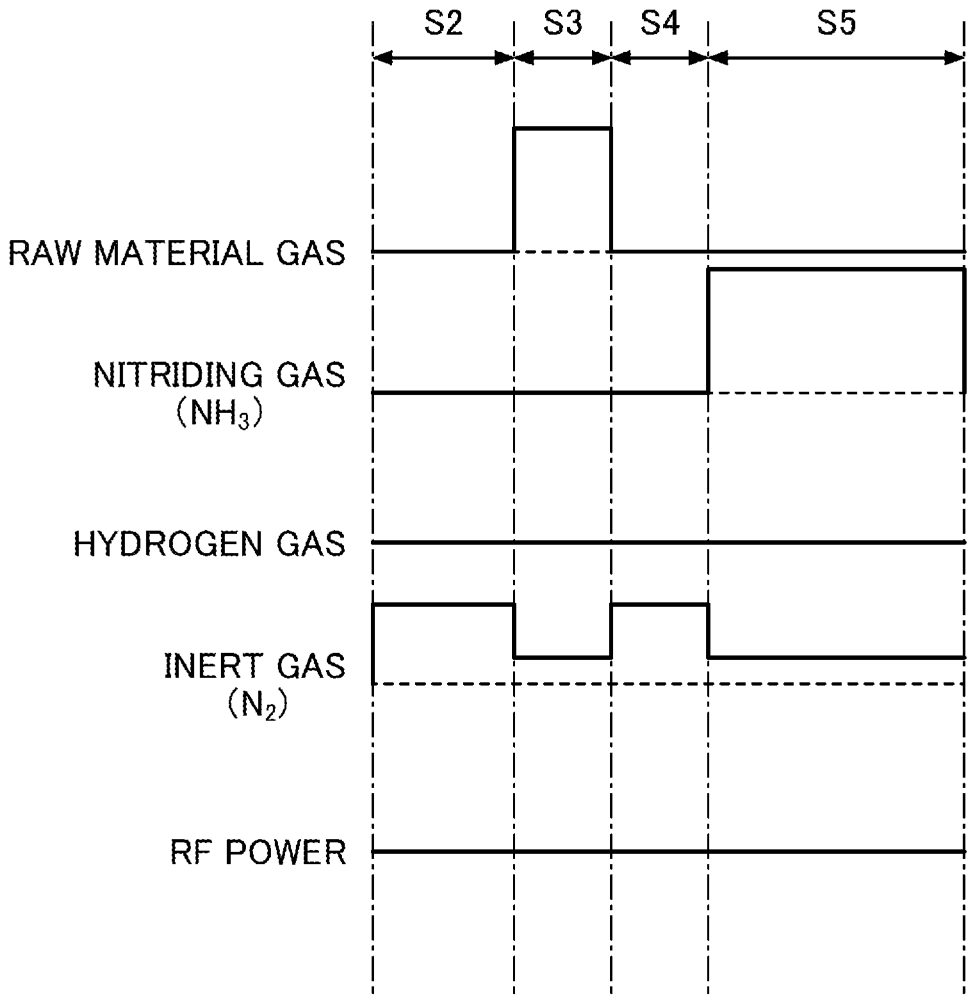
FIG. 2 is a timing chart in relation to the film forming method of FIG. 1.
Figure 3:
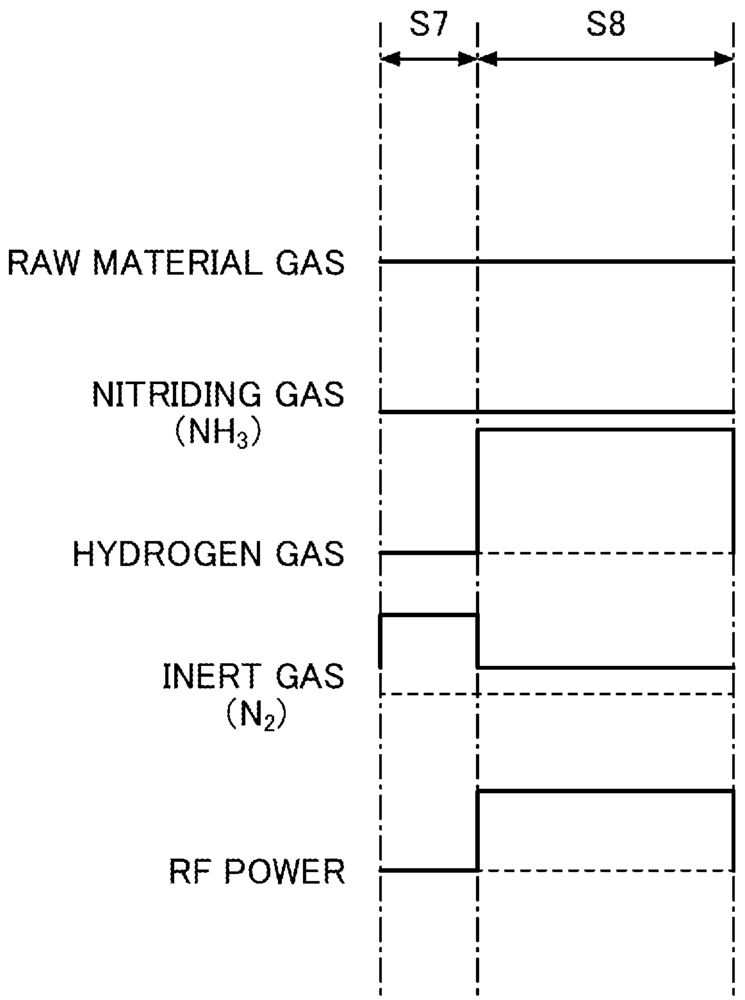
FIG. 3 is a timing chart in relation to the film forming method of FIG. 1.
Figure 4:
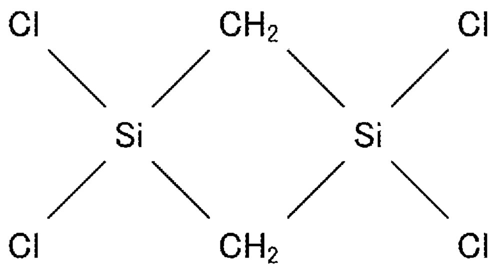
FIG. 4 is a diagram of a structural formula of one example of the raw material gas used in the film forming method of FIG. 1.

Referring to FIG. 1 to FIG. 4, the film forming method according to the embodiment will be described. FIG. 1 is a flowchart illustrating the film forming method according to the embodiment. The film forming method according to the embodiment includes a providing step S1, a purging step S2, an adsorbing step S3, a purging step S4, a thermally nitriding step S5, a determining step S6, a purging step S7, a reforming step S8, and a determining step S9. FIG. 2 is a timing chart in relation to the film forming method of FIG. 1, and indicates the timings for supplying gases and a RF power in purging step S2 to thermally nitriding step S5. FIG. 3 is a timing chart in relation to the film forming method of FIG. 1, and indicates the timings for supplying gases and a RF power in purging step S7 to reforming step S8. FIG. 4 is a diagram of a structural formula of one example of the raw material gas used in the film forming method of FIG. 1.

Providing step S1 includes providing the substrate. The substrate may be, for example, a silicon wafer. The substrate may have a recessed portion in a surface thereof, such as a trench, a hole, or the like. The substrate may include an underlying film at a surface thereof, such as a silicon nitride film or the like.

Purging step S2 is performed after providing step S1. As illustrated in FIG. 2, purging step S2 includes supplying inert gas to the surface of the substrate and purging the surface of the substrate. The inert gas may be, for example, nitrogen ($N_2$) gas. The inert gas may be, for example, a noble gas, such as helium (He) gas, argon (Ar) gas, or the like.

Adsorbing step S3 is performed after purging step S2. As illustrated in FIG. 2, adsorbing step S3 includes supplying the raw material gas to the surface of the substrate, and adsorbing the raw material gas to the surface of the substrate. The raw material gas is a cyclic silicon carbide compound having, in a molecule thereof, a cyclic structure including a silicon (Si) atom and a carbon (C) atom. For example, the raw material gas may have, in a molecule thereof, a four-membered cyclic structure including a silicon atom and a carbon atom. The raw material gas may have, in a molecule thereof, a substituent of a halogen such as chlorine (Cl) or the like. One example of the raw material gas is 1,1,3,3-tetrachloro-1,3-disilacyclobutane ($Si_2C_2Cl_4H_4$) expressed by the structural formula of FIG. 4. As illustrated in FIG. 2, adsorbing step S3 may include supplying inert gas to the surface of the substrate at a flow rate lower than in purging step S2. The inert gas may be the same as the inert gas used in purging step S2. Adsorbing step S3 may include, for example, maintaining the substrate at a temperature that is 300° C. or higher and 700° C. or lower.

Purging step $4 is performed after adsorbing step S3. As illustrated in FIG. 2, purging step S4 includes supplying inert gas to the surface of the substrate and purging the surface of the substrate. The inert gas may be the same as the inert gas used in purging step S2.

Thermally nitriding step S5 is performed after purging step S4. Thermally nitriding step S5 includes thermally treating the substrate in an atmosphere including nitriding gas without supply of a RF power, thereby thermally nitriding the raw material gas adsorbed to the surface of the substrate in adsorbing step S3. Thereby, a SiCN film is formed at the surface of the substrate. The nitriding gas is gas for nitriding the raw material gas. The nitriding gas may be, for example, ammonia ($NH_3$) gas. The nitriding gas may be hydrazine ($N_2H_4$) gas. As illustrated in FIG. 2, thermally nitriding step S5 may include supplying inert gas to the surface of the substrate at a flow rate lower than in purging step S2. The inert gas may be the same as the inert gas used in purging step S2. Thermally nitriding step S5 includes, for example, maintaining the substrate at a temperature that is 300° C. or higher and 700° C. or lower.

Determining step S6 is performed after thermally nitriding step S5. Determining step S6 includes determining whether or not a process from purging step S2 to thermally nitriding step S5 has been performed a set number of times. When the process is not performed the set number of times ("NO" in determining step S6), the process from purging step S2 to thermally nitriding step S5 is performed again. When the process is performed the set number of times ("YES" in determining step S6), the flow proceeds to purging step S7. In this way, the process from purging step S2 to thermally nitriding step S5 performed in order is repeated a plurality of times until the process is performed the set number of times.

As illustrated in FIG. 3, purging step S7 includes supplying inert gas to the surface of the substrate and purging the surface of the substrate. The inert gas may be the same as the inert gas used in purging step S2.

Reforming step S8 is performed after purging step S7. Reforming step S8 includes exposing the substrate to a hydrogen plasma, thereby reforming the thermally nitrided raw material gas. As illustrated in FIG. 3, reforming step S8 may include supplying hydrogen gas to the substrate and supplying a RF power, thereby generating a hydrogen plasma. As illustrated in FIG. 3, reforming step S8 may include supplying inert gas at the same time as the hydrogen gas. The flow rate ratio of hydrogen gas:inert gas may be, for example, in the range of 5:95 to 100:0. Reforming step S8 includes, for example, maintaining the substrate at a temperature that is 300° C. or higher and 700° C. or lower.

Determining step S9 is performed after reforming step S8. Determining step S9 includes determining whether or not a process from purging step S2 to reforming step S8 has been performed a set number of times. When the process is not performed the set number of times ("NO" in determining step S9), the process from purging step S2 to reforming step S8 is performed again. When the process is performed the set number of times ("YES" in determining step S9), the flow ends. In this way, the process from purging step S2 to reforming step S8 performed in order is repeated a plurality of times until the process is performed the set number of times.

According to the film forming method according to the embodiment as described above, the SiCN film is reformed by exposing the SiCN film to the hydrogen plasma in the course of forming the SiCN film through supply of the raw material gas and thermally nitriding the raw material gas, the raw material gas having, in a molecule thereof, a cyclic structure including a silicon atom and a carbon atom. Thereby, it is possible to form a SiCN film that is not prone to oxidation.

[Film Forming Apparatus]

Figure 5:
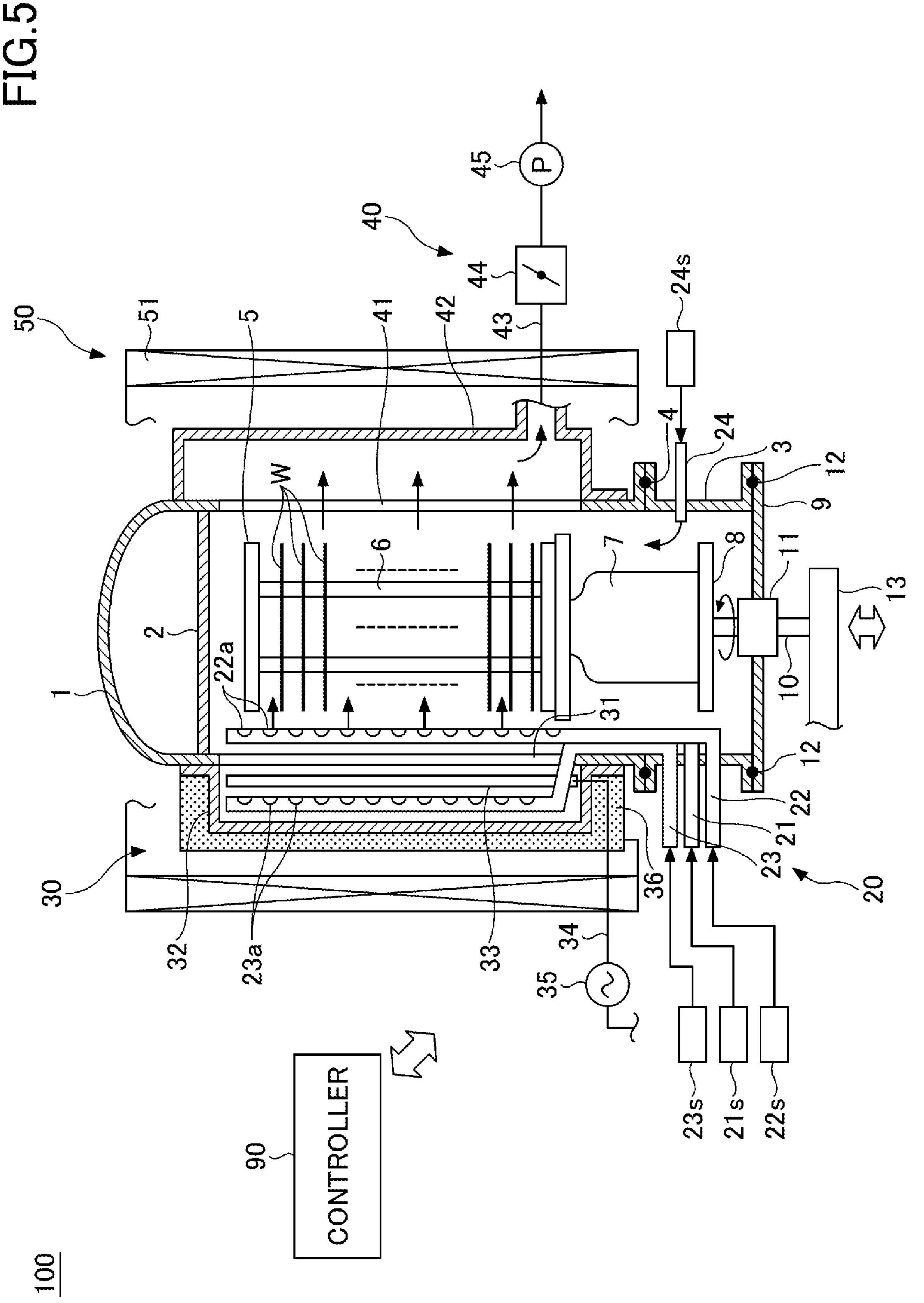
FIG. 5 is a schematic view illustrating a film forming apparatus according to an embodiment.
Figure 6:
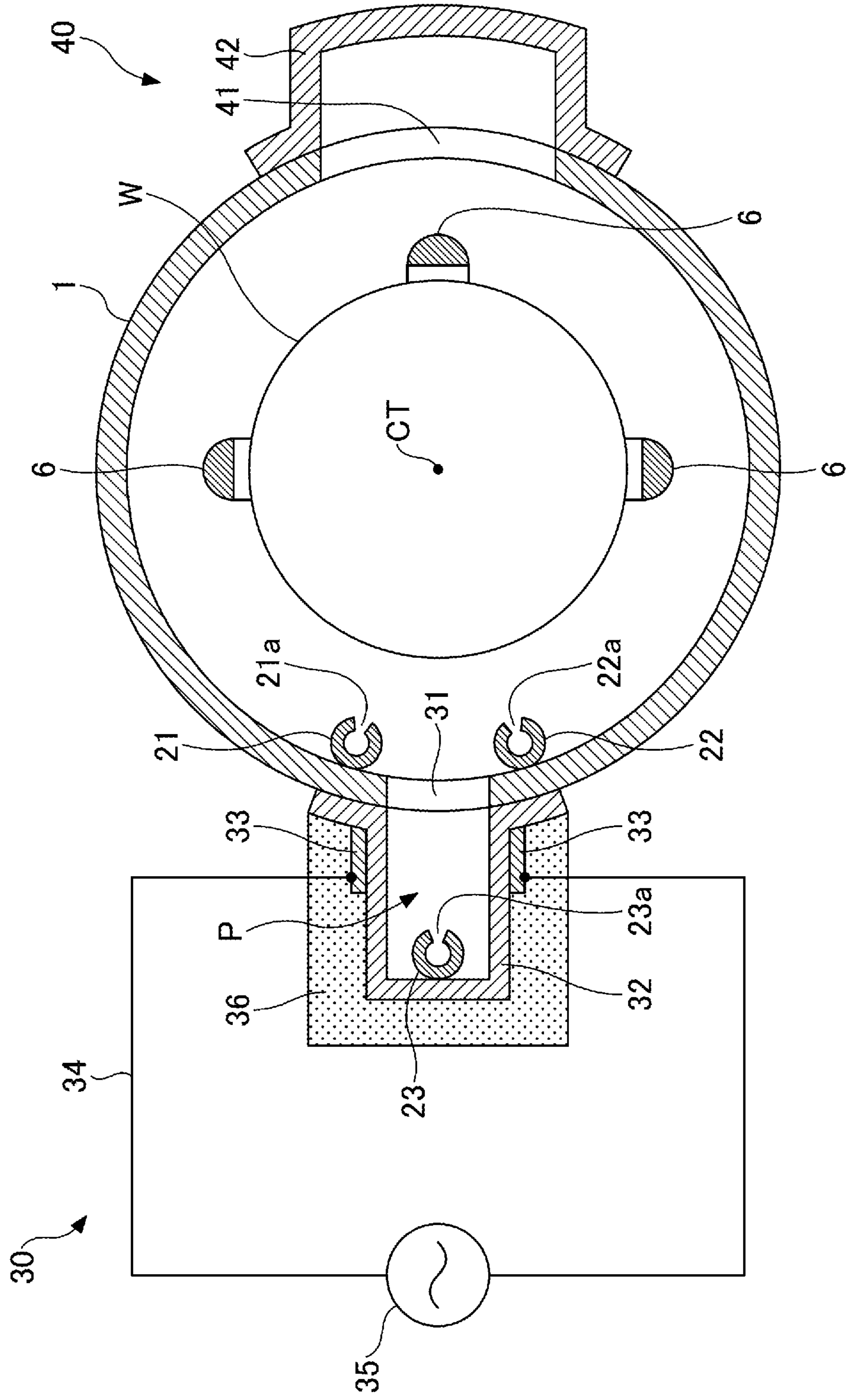
FIG. 6 is a schematic view illustrating the film forming apparatus according to the embodiment.

Referring to FIG. 5 and FIG. 6, a film forming apparatus 100 according to an embodiment will be described. FIG. 5 and FIG. 6 are each a schematic view illustrating the film forming apparatus 100 according to the embodiment. As illustrated in FIG. 5 and FIG. 6, the film forming apparatus 100 mainly includes a process chamber 1, a gas supply 20, a plasma generator 30, an exhauster 40, a heater 50, and a controller 90.

The process chamber 1 has a vertical cylindrical shape that includes the ceiling and is opened at the bottom thereof. The entirety of the process chamber 1 is formed of, for example, quartz. A ceiling plate 2 is provided near the top in the process chamber 1, and a region lower than the ceiling plate 2 is sealed. The ceiling plate 2 is formed of, for example, quartz. A manifold 3 formed of metal so as to have a cylindrical shape is connected via a seal member 4 to the opening at the bottom of the process chamber 1. The seal member 4 may be, for example, an O-ring.

The manifold 3 supports the bottom of the process chamber 1. A boat 5 is inserted into the process chamber 1 from below the manifold 3. The boat 5 approximately horizontally retains a plurality of (e.g., from 25 through 150) substrates W at intervals along an upward-and-downward direction. The substrate W may be, for example, a semiconductor wafer. The boat 5 is formed of, for example, quartz. The boat 5 includes, for example, three supports 6, and the plurality of substrates W are supported by grooves formed in each of the supports 6.

The boat 5 is placed on a rotatable stage 8 via a heat-retaining cylinder 7. The heat-retaining cylinder 7 is formed of, for example, quartz. The heat-retaining cylinder 7 suppresses release of heat from the opening at the bottom of the manifold 3. The rotatable stage 8 is supported on a rotation shaft 10. The opening at the bottom of the manifold 3 is opened and closed with a cover 9. The cover 9 is formed of, for example, a metal material such as stainless steel or the like. The rotation shaft 10 penetrates the cover 9.

A penetrating portion of the rotation shaft 10 is provided with a magnetic fluid seal 11. The magnetic fluid seal 11 airtightly seals the rotation shaft 10 and rotatably supports the rotation shaft 10. A seal member 12 is provided between a peripheral portion of the cover 9 and the bottom of the manifold 3 in order to maintain airtightness of the interior of the process chamber 1. The seal member 12 may be, for example, an O-ring.

The rotation shaft 10 is attached to a tip of an arm 13 supported by, for example, an ascending and descending mechanism such as a boat elevator or the like. In response to ascending or descending of the arm 13, the boat 5, the heat-retaining cylinder 7, the rotatable stage 8, and the cover 9 ascend or descend integrally with the rotation shaft, and are inserted into or released from the process chamber 1.

The gas supply 20 supplies various gases into the process chamber 1. The gas supply 20 includes, for example, four gas nozzles 21, 22, 23, and 24. The gas supply 20 may further include another gas nozzle.

The gas nozzle 21 has an L shape that penetrates the lateral wall of the manifold 3 inward, and bends upward and extends vertically. The gas nozzle 21 is formed of, for example, quartz. The gas nozzle 21 is connected to a supply source 21*s* of the raw material gas. A vertical portion of the gas nozzle 21 is provided in the process chamber 1. The vertical portion of the gas nozzle 21 is provided with a plurality of gas holes 21*a* disposed at intervals over the length in the upward-and-downward direction corresponding to a range in which the boat 5 supports the substrates. The gas holes 21*a* are, for example, oriented toward a center CT of the process chamber 1, and discharge the raw material gas in the horizontal direction toward the center CT of the process chamber 1. The raw material gas is a cyclic silicon carbide compound having, in a molecule thereof, a cyclic structure including a silicon atom and a carbon atom. For example, the raw material gas may have, in a molecule thereof, a four-membered cyclic structure including a silicon atom and a carbon atom. The raw material gas may have, in a molecule thereof, a substituent of a halogen such as chlorine or the like. One example of the raw material gas is 1,1,3,3-tetrachloro-1,3-disilacyclobutane expressed by the structural formula of FIG. 4.

The gas nozzle 22 has an L shape that penetrates the lateral wall of the manifold 3 inward, and bends upward and extends vertically. The gas nozzle 22 is formed of, for example, quartz. The gas nozzle 22 is connected to a supply source 22*s* of the nitriding gas. A vertical portion of the gas nozzle 22 is provided in the process chamber 1. The vertical portion of the gas nozzle 22 is provided with a plurality of gas holes 22*a* disposed at intervals over the length in the upward-and-downward direction corresponding to the range in which the boat 5 supports the substrates. The gas holes 22*a* are, for example, oriented toward the center CT of the process chamber 1, and discharge the nitriding gas in the horizontal direction toward the center CT of the process chamber 1. The nitriding gas is gas for nitriding the raw material gas. The nitriding gas may be, for example, ammonia gas. The nitriding gas may be hydrazine gas.

The gas nozzle 23 has an L shape that penetrates the lateral wall of the manifold 3 inward, and bends upward and extends vertically. The gas nozzle 23 is formed of, for example, quartz. The gas nozzle 23 is connected to a supply source 23*s* of the hydrogen gas. A vertical portion of the gas nozzle 23 is provided in a plasma-generating space P as described below. The vertical portion of the gas nozzle 23 is provided with a plurality of gas holes 23*a* disposed at intervals over the length in the upward-and-downward direction corresponding to the range in which the boat 5 supports the substrates. The gas holes 23*a* are, for example, oriented toward the center CT of the process chamber 1, and discharge the hydrogen gas in the horizontal direction toward the center CT of the process chamber 1. The gas nozzle 23 may be further connected to an unillustrated supply source of the inert gas. The inert gas may be, for example, nitrogen gas. The inert gas may be a noble gas, such as helium gas, argon gas, or the like.

The gas nozzle 24 has a straight-tube shape that penetrates the lateral wall of the manifold 3 and extends horizontally. The gas nozzle 24 is formed of, for example, quartz. The gas nozzle 24 is connected to a supply source 24*s* of the inert gas. A tip of the gas nozzle 24 is provided in the process chamber 1. The tip of the gas nozzle 24 has an opening, and the gas nozzle 24 supplies the inert gas to the process chamber 1 through the opening. The inert gas may be, for example, nitrogen gas. The inert gas may be a noble gas, such as helium gas, argon gas, or the like.

The plasma generator 30 is formed at a part of the lateral wall of the process chamber 1. The plasma generator 30 generates a plasma from the hydrogen gas supplied from the gas nozzle 23. The plasma generator 30 includes a plasma partition wall 32, a pair of plasma electrodes 33, a power supply line 34, a RF power source 35, and an insulating protection cover 36.

The plasma partition wall 32 is airtightly welded to the outer wall of the process chamber 1. The plasma partition wall 32 is formed of, for example, quartz. A cross section of the plasma partition wall 32 forms a recessed shape, and the plasma partition wall 32 covers an opening 31 formed in the lateral wall of the process chamber 1. The opening 31 is formed so as to be narrow and long in the upward-and-downward direction so as to cover all of the substrates W supported by the boat 5 in the upward-and-downward direction. The gas nozzle 23 is disposed in the plasma-generating space P that is defined by the plasma partition wall 32 and is an inner space in communication with the interior of the process chamber 1. The gas nozzle 21 and the gas nozzle 22 are provided at positions near the substrates W along the inner wall of the process chamber 1 external of the plasma-generating space P.

The pair of plasma electrodes 33 each have an elongated shape, and are disposed along the upward-and-downward direction so as to face the outer surfaces of the walls on both sides of the plasma partition wall 32. The power supply line 34 is connected to the bottom of each plasma electrode 33.

The power supply line 34 electrically connects each plasma electrode 33 and the RF power source 35 to each other. For example, one end of the power supply line 34 is connected to the bottom, which is a lateral portion of a shorter side of each plasma electrode 33, and the other end thereof is connected to the RF power source 35.

The RF power source 35 is electrically connected via the power supply line 34 to the bottom of each plasma electrode 33. The RF power source 35 supplies a RF power of, for example, 13.56 MHz to the pair of plasma electrodes 33. Thereby, the RF power is applied to the plasma-generating space P defined by the plasma partition wall 32.

The insulating protection cover 36 is attached to the outer surface of the plasma partition wall 32 so as to cover the plasma partition wall 32. An inner portion of the insulating protection cover 36 is provided with an unillustrated coolant-flowing path. By passing a coolant (e.g., cooled nitrogen gas) through the coolant-flowing path, the plasma electrodes 33 are cooled. Between the plasma electrodes 33 and the insulating protection cover 36, an unillustrated shield may be provided so as to cover the plasma electrodes 33. The shield is formed of, for example, a good conductor such as a metal or the like, and is electrically grounded.

The exhauster 40 is provided in an exhausting port 41 formed in a portion of the lateral wall of the process chamber 1, the portion facing the opening 31. The exhausting port 41 is formed so as to be narrow and long upward and downward correspondingly to the boat 5. A cover member 42 is attached to a portion of the process chamber 1 corresponding to the exhausting port 41. A cross section of the cover member 42 is formed in a U shape so as to cover the exhausting port 41. The cover member 42 extends upward along the lateral wall of the process chamber 1. An exhausting tube 43 is connected to a lower portion of the cover member 42. The exhausting tube 43 is provided with a pressure regulation valve 44 and a vacuum pump 45 in order from upstream to downstream in a gas-flowing direction. The exhauster 40 drives the pressure regulation valve 44 and the vacuum pump 45 based on control of the controller 90, and regulates the inner pressure of the process chamber 1 by the pressure regulation valve 44 while suctioning the gas in the process chamber 1 into the vacuum pump 45.

The heater 50 includes a heat generator 51. The heat generator 51 has a cylindrical shape that encloses the process chamber 1 outside in a radial direction of the process chamber 1. The heat generator 51 heats the entire lateral periphery of the process chamber 1, thereby heating the substrates W housed in the process chamber 1. The controller 90, for example, controls the operations of the components of the film forming apparatus 100. The controller 90 may be, for example, a computer. A program for causing the computer to execute the operations of the components of the film forming apparatus 100 is stored in a storage medium. The storage medium may be, for example, a flexible disc, a compact disc, a hard disc, a flash memory, or a digital versatile disc (DVD).

[Operations of the Film Forming Apparatus]

Operations of the film forming apparatus 100 in performing the film forming method according to the embodiment by the film forming apparatus 100 will be described.

First, the controller 90 raises the arm 13 and transfers the boat 5, which has retained the plurality of substrates W, into the process chamber 1, and airtightly seals the bottom opening of the process chamber 1 with the cover 9. Subsequently, the controller 90 controls the exhauster 40 so that the interior of the process chamber 1 becomes a set pressure, and controls the heater 50 so that the substrates W become a set temperature. The set temperature may be, for example, a temperature that is 300° C. or higher and 700° C. or lower.

Next, the controller 90 controls the components of the film forming apparatus 100 so as to perform purging step S2. For example, in a state where the substrates W are maintained at the set temperature, the controller 90 controls the gas supply 20 and the heater 50 so as to supply the inert gas into the process chamber 1 from the gas nozzle 24. Thereby, the surfaces of the substrates W are purged.

Next, the controller 90 controls the components of the film forming apparatus 100 so as to perform adsorbing step S3. For example, in a state where the substrates W are maintained at the set temperature, the controller 90 controls the gas supply 20 and the heater 50 so as to supply the raw material gas into the process chamber 1 from the gas nozzle 21. Thereby, the raw material gas is adsorbed to the surfaces of the substrates W. After the raw material gas has been supplied into the process chamber 1 from the gas nozzle 21, the controller 90 may control the gas supply 20, the exhauster 40, and the heater 50 so as to maintain a state where supply of the raw material gas into the process chamber 1 and discharge of the raw material gas from the process chamber 1 are stopped. In this case, the adsorption of the raw material gas to the surfaces of the substrates W is promoted. The duration of adsorbing step S3 may be, for example, 60 seconds.

Next, the controller 90 controls the components of the film forming apparatus 100 so as to perform purging step S4. For example, in a state where the substrates W are maintained at the set temperature, the controller 90 controls the gas supply 20 and the heater 50 so as to supply the inert gas into the process chamber 1 from the gas nozzle 24. Thereby, the surfaces of the substrates W are purged.

Next, the controller 90 controls the components of the film forming apparatus 100 so as to perform thermally nitriding step S5. For example, in a state where the substrates W are maintained at the set temperature, the controller 90 controls the gas supply 20 and the heater 50 so as to supply the nitriding gas into the process chamber 1 from the gas nozzle 22. Thereby, the substrates W are thermally treated in an atmosphere of the nitriding gas, and the raw material gas adsorbed to the surfaces of the substrates W is thermally nitrided. The duration of thermally nitriding step S5 may be, for example, 60 seconds.

Next, the controller 90 performs determining step S6. For example, the controller 90 determines whether or not a process from purging step S2 to thermally nitriding step S5 has been performed a set number of times. When the process is not performed the set number of times, the controller 90 controls the components of the film forming apparatus 100 so as to perform the process from purging step S2 to thermally nitriding step S5 again. When the process is performed the set number of times, the flow proceeds to purging step S7. In this way, the controller 90 controls the components of the film forming apparatus 100 so as to repeat the process from purging step S2 to thermally nitriding step S5 performed in order until the process is performed the set number of times.

Next, the controller 90 controls the components of the film forming apparatus 100 so as to perform purging step S7. For example, in a state where the substrates W are maintained at the set temperature, the controller 90 controls the gas supply 20 and the heater 50 so as to supply the inert gas into the process chamber 1 from the gas nozzle 24. Thereby, the surfaces of the substrates W are purged.

Next, the controller 90 controls the components of the film forming apparatus 100 so as to perform reforming step S8. For example, in a state where the substrates W are maintained at the set temperature, the controller 90 controls the gas supply 20, the plasma generator 30, and the heater 50 so as to supply the hydrogen gas from the gas nozzle 23 and supply the RF power to the pair of plasma electrodes 33 from the RF power source 35. Thereby, the substrates W are exposed to a hydrogen plasma, and the thermally nitrided raw material gas is reformed. The duration of reforming step S8 may be, for example, 5 seconds or longer and 180 seconds or shorter.

Next, the controller 90 performs determining step S9. For example, the controller 90 determines whether or not the process from purging step S2 to reforming step S8 has been performed a set number of times. When the process is not performed the set number of times, the controller 90 controls the components of the film forming apparatus 100 so as to perform the process from purging step S2 to reforming step S8 again. When the process is performed the set number of times, the flow ends. In this way, the controller 90 controls the film forming apparatus 100 so as to repeat the process from purging step S2 to reforming step S8 performed in order until the process is performed the set number of times.

Next, the controller 90 increases the inner pressure of the process chamber 1 to the atmospheric pressure and decreases the inner temperature of the process chamber 1 to a dischargeable temperature, and then discharges the boat 5 from the process chamber 1 by descending the arm 13. Through the above-described procedure, the treatment of the substrates W is completed.

EXAMPLES

The present disclosure will be described below by way of examples, in which SiCN films were formed by the film forming method according to the embodiment and evaluated for film properties.

Example 1

In Example 1, a SiCN film was formed by the film forming method according to the embodiment, and the formed SiCN film was measured for the growth per cycle (GPC), i.e., the amount of the film formed per cycle.

Figure 7:
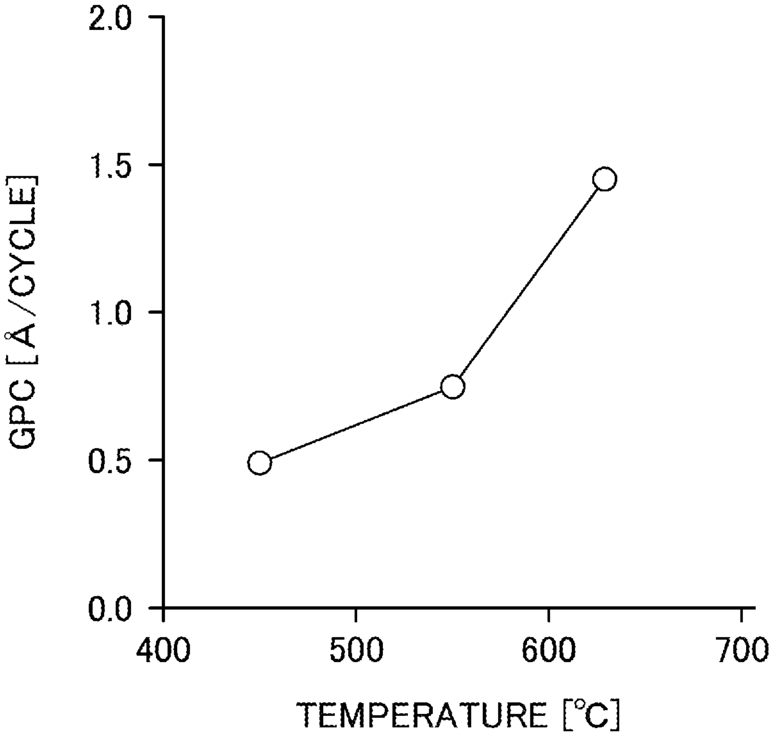
FIG. 7 is a view illustrating a growth per cycle (GPC) of a SiCN film.

FIG. 7 is a view illustrating the GPC of the SiCN film. In FIG. 7, the horizontal axis indicates a substrate temperature [° C.], and the vertical axis indicates the GPC [angstroms/cycle] of the SiCN film.

As illustrated in FIG. 7, the GPC of the SiCN film was about 0.5 angstroms/cycle when the substrate temperature was 430° C., the GPC of the SiCN film was about 0.75 angstroms/cycle when the substrate temperature was 550° C., and the GPC of the SiCN film was about 1.5 angstroms/cycle when the substrate temperature was 630° C. This result suggests that through the thermally nitriding process without the use of a plasma, it is possible to form the SiCN films in a relatively low temperature range of 430° C. or higher and 630° C. or lower. A conceivable reason for this is as follows. Specifically, when the thermally nitrided SiCN film is exposed to the hydrogen plasma, the terminal H of —NH existing on the surface of the thermally nitrided SiCN film is eliminated. The elimination of H lowers activation energy. As a result, a SiN bond becomes more readily formed compared to the case in which the substrate is not exposed to the hydrogen plasma.

Example 2

In Example 2, a SiCN film was formed by the film forming method according to the embodiment, and the formed SiCN film was measured for the film composition through X-ray photoelectron spectroscopy (XPS). In Example 2, the substrate was housed in the process chamber 1 of the film forming apparatus 100, and a process from purging step S2 to determining step S9 was performed. In Example 2, the substrate temperature in performing the process from purging step S2 to determining step S9 was set to three different conditions, i.e., 450° C., 550° C., and 630° C. At each of the three different conditions, the duration of reforming step S8 was set to three different conditions, i.e., 0 seconds, 30 seconds, and 60 seconds.

Figure 8:
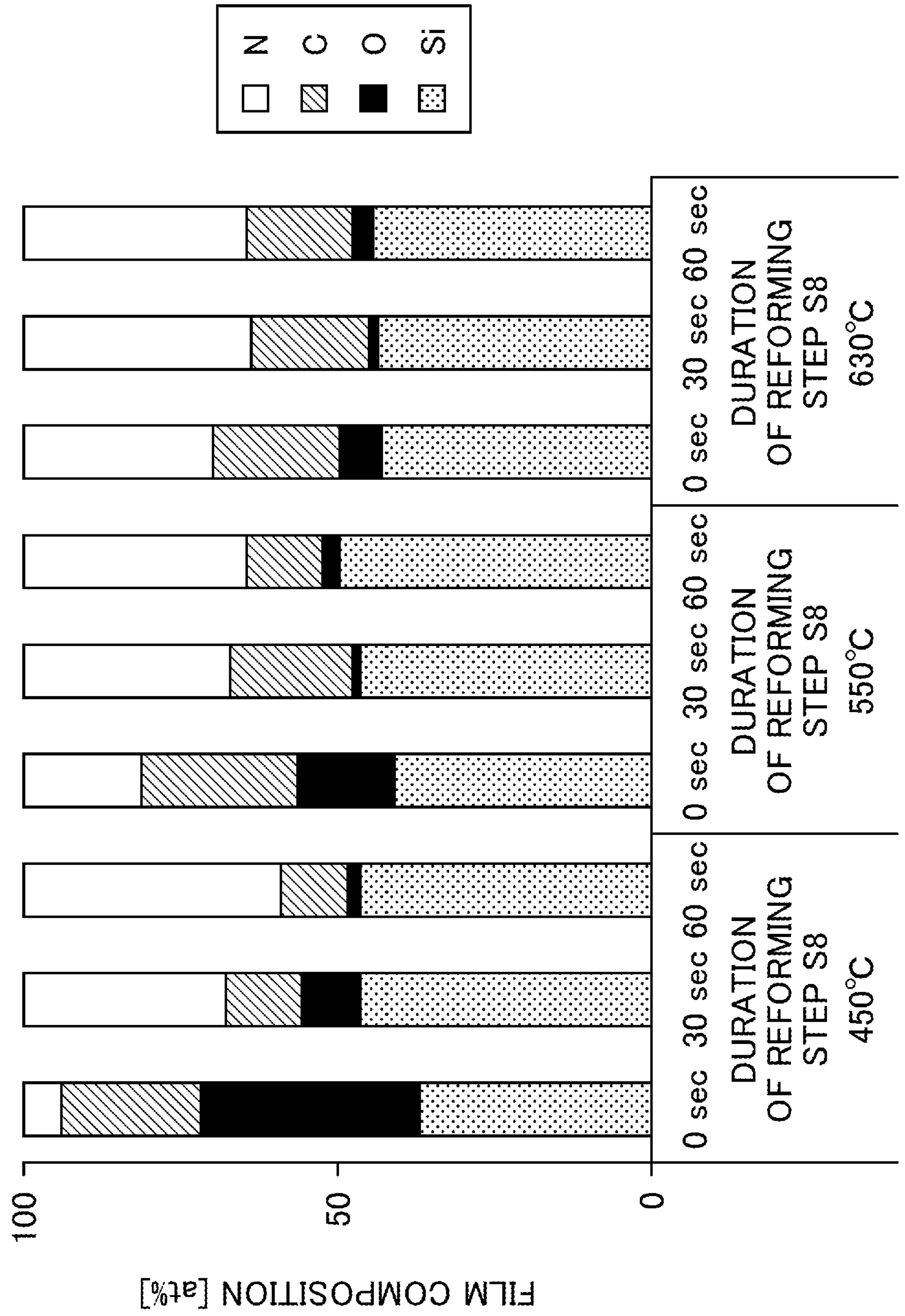
FIG. 8 is a view illustrating a film composition of the SiCN film.

FIG. 8 is a view illustrating a film composition of the SiCN film. FIG. 8 indicates proportions [at %] of silicon (Si), oxygen (O), carbon (C), and nitrogen (N) included in each of the SiCN films formed under the above-described conditions.

As illustrated in FIG. 8, in all of the conditions in which the substrate temperature was 450° C., 550° C., and 630° C., the proportion of oxygen in the SiCN film was lower in the presence of reforming step S8 than in the absence of reforming step S8 (i.e., the duration of reforming step S8 is 0 seconds). This result suggests that when the thermally nitrided SiCN film is exposed to the hydrogen plasma, the resulting SiCN film becomes stable and is not prone to oxidation.

As illustrated in FIG. 8, when the substrate temperature was 450° C., the proportion of oxygen in the SiCN film decreased and the proportion of nitrogen in the SiCN film increased by extending the duration of reforming step S8 from 30 seconds to 60 seconds. This result suggests that when the substrate temperature is 450° C., the film composition of the SiCN film can be adjusted by changing the duration of reforming step S8.

As illustrated in FIG. 8, when the substrate temperature was 630° C., the proportions of silicon, oxygen, carbon, and nitrogen in the SiCN film did not greatly change even by extending the duration of reforming step S8 from 30 seconds to 60 seconds. This result suggests that when the substrate temperature is 630° C., the resulting SiCN film becomes stable and is not prone to oxidation even if the duration of reforming step S8 is short.

Example 3

In Example 3, the density of the SiCN film formed under the same conditions as in Example 2 was measured.

Figure 9:
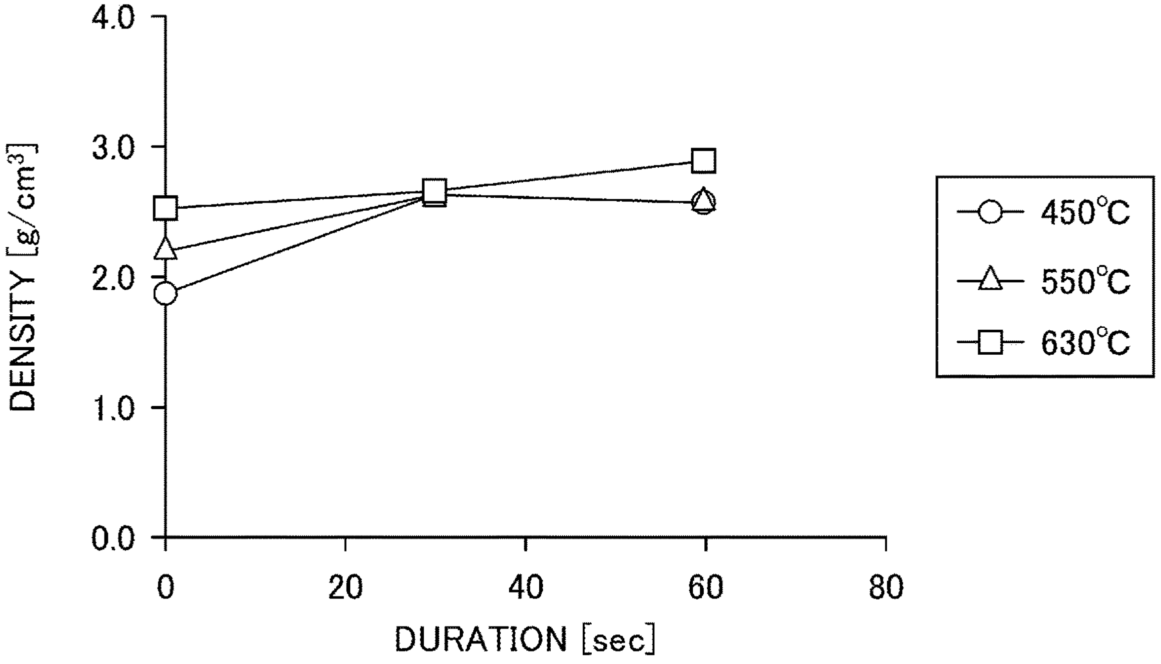
FIG. 9 is a view illustrating a density of the SiCN film.

FIG. 9 is a view illustrating the density of the SiCN film. In FIG. 9, the horizontal axis indicates the duration [sec] of reforming step S8, and the vertical axis indicates the density [g/cm$^3$] of the SiCN film. In FIG. 9, a circular mark indicates the result obtained when the substrate temperature was 450° C., a triangular mark indicates the result obtained when the substrate temperature was 550° C., and a rectangular mark indicates the result obtained when the substrate temperature was 630° C.

As illustrated in FIG. 9, in all of the conditions in which the substrate temperature was 450° C., 550° C., and 630° C., the density of the SiCN film was higher in the presence of reforming step S8 than in the absence of reforming step S8. This result suggests that when the thermally nitrided SiCN film is exposed to the hydrogen plasma, the resulting SiCN film has a higher density.

Example 4

In Example 4, the SiCN film formed under the same conditions as in Example 2 was measured for the wet etching rate (WER). In Example 4, the WER was defined as an etching rate of the SiCN film when the substrate having the SiCN film formed was immersed in 50% hydrofluoric acid (HF).

Figure 10:
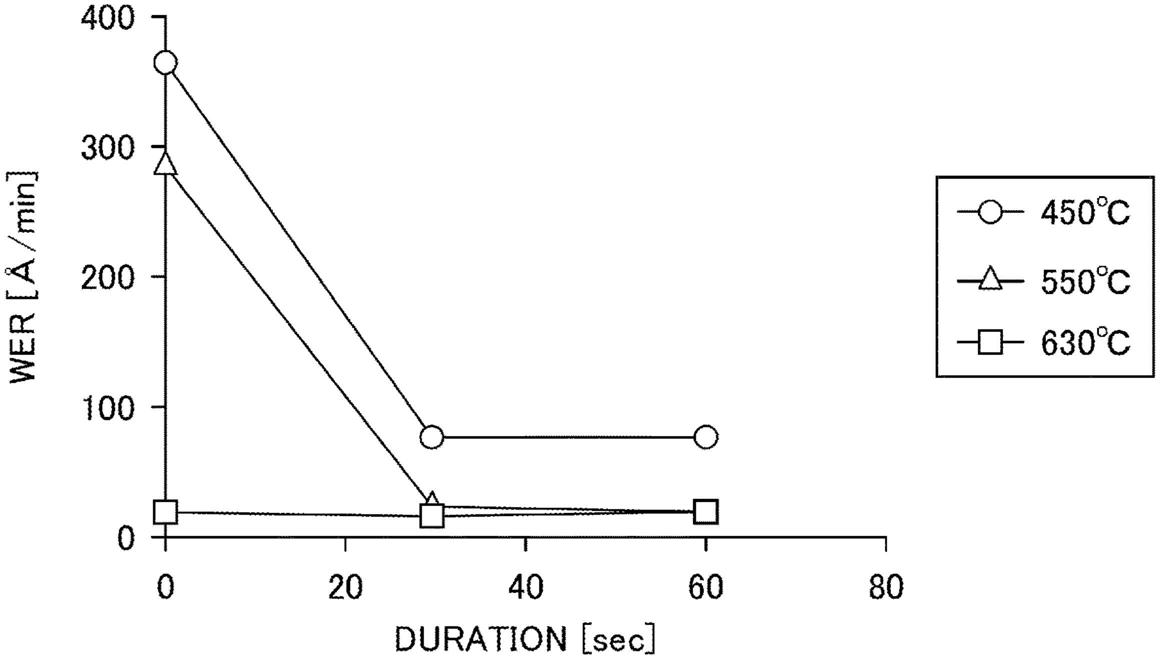
FIG. 10 is a view illustrating a wet etching rate (WER) of the SiCN film.

FIG. 10 is a view illustrating the WER of the SiCN film. In FIG. 10, the horizontal axis indicates the duration [sec] of reforming step S8, and the vertical axis indicates the WER [angstroms/min] of the SiCN film. In FIG. 10, a circular mark indicates the result obtained when the substrate temperature was 450° C., a triangular mark indicates the result obtained when the substrate temperature was 550° C., and a rectangular mark indicates the result obtained when the substrate temperature was 630° C.

As illustrated in FIG. 10, when the substrate temperature was 450° C. or 550° C., the WER of the SiCN film was lower in the presence of reforming step S8 than in the absence of reforming step S8. This result suggests that when the thermally nitrided SiCN film is exposed to the hydrogen plasma, the resulting SiCN film has an increased etching resistance to hydrofluoric acid.

Example 5

In Example 5, through Fourier transform infrared spectroscopy (FTIR), the SiCN film formed under the same conditions as in Example 2 was measured for the bonding state.

Figure 11:
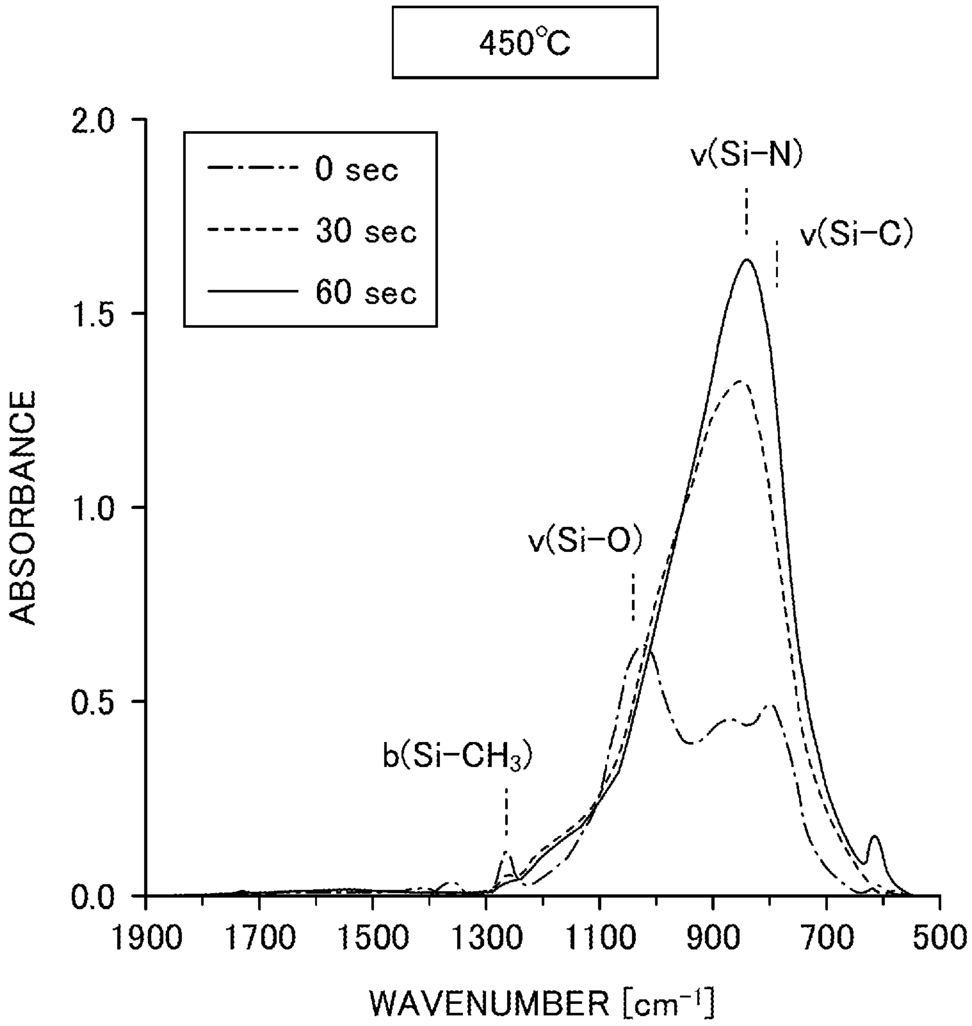
FIG. 11 is a view illustrating a bonding state of the SiCN film.

FIG. 11 is a view illustrating the bonding state of the SiCN film, and illustrates a FTIR spectrum of the SiCN film obtained when the substrate temperature was 450° C. In FIG. 11, the horizontal axis indicates wavenumber [cm$^{-1}$], and the vertical axis indicates absorbance. In FIG. 11, the result obtained when the duration of reforming step S8 was 60 seconds is denoted by a solid line, the result obtained when the duration of reforming step S8 was 30 seconds is denoted by a dashed line, and the result obtained when the duration of reforming step S8 was 0 seconds is denoted by a chain line.

As illustrated in FIG. 11, a peak attributed to the Si—$CH_3$ bond appears in the absence of reforming step S8, while approximately no peak attributed to the Si—$CH_3$ bond appears in the presence of reforming step S8. This result suggests that when the thermally nitrided SiCN film is exposed to the hydrogen plasma, the terminal group is removed.

As illustrated in FIG. 11, a peak attributed to the Si—O bond appears in the absence of reforming step S8, while no peak attributed to the Si—O bond appears in the presence of reforming step S8. This result suggests that when the thermally nitrided SiCN film is exposed to the hydrogen plasma, oxidation in open air is suppressed. As illustrated in FIG. 11, no peak attributed to the Si—N bond appears in the absence of reforming step S8, while a peak attributed to the Si—N bond appears in the presence of reforming step S8. This result suggests that when the thermally nitrided SiCN film is exposed to the hydrogen plasma, the number of the Si—N bonds increases.

Figure 12:
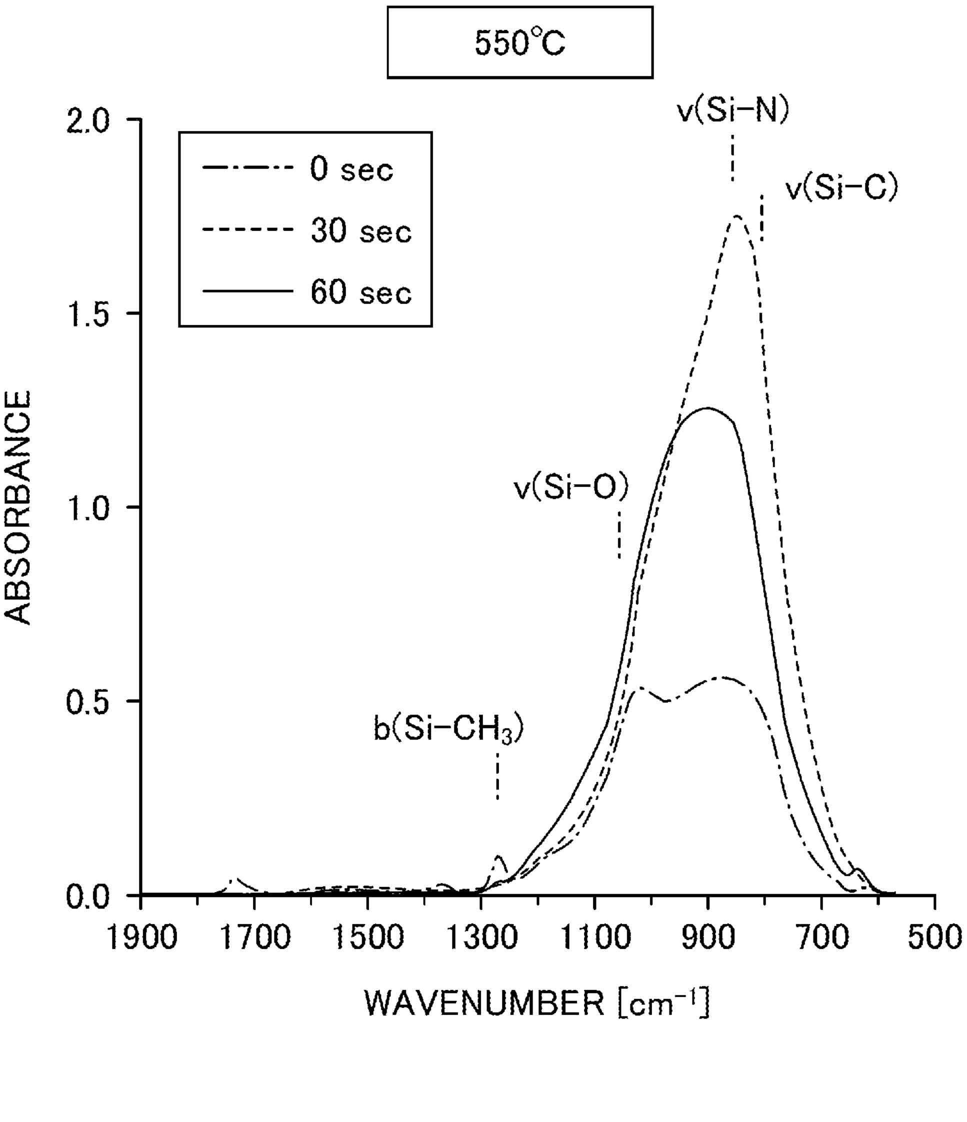
FIG. 12 is a view illustrating the bonding state of the SiCN film.

FIG. 12 is a view illustrating the bonding state of the SiCN film, and illustrates a FTIR spectrum of the SiCN film obtained when the substrate temperature was 550° C. In FIG. 12, the horizontal axis indicates wavenumber [$cm^{-1}$], and the vertical axis indicates absorbance. In FIG. 12, the result obtained when the duration of reforming step S8 was 60 seconds is denoted by a solid line, the result obtained when the duration of reforming step S8 was 30 seconds is denoted by a dashed line, and the result obtained when the duration of reforming step S8 was 0 seconds is denoted by a chain line.

As illustrated in FIG. 12, when the duration of reforming step S8 is 30 seconds, a peak attributed to the Si—N bond becomes larger by increasing the substrate temperature from 450° C. to 550° C. This result suggests that when the duration of reforming step S8 is 30 seconds, the number of Si—N bonds increases by increasing the substrate temperature from 450° C. to 550° C.

As illustrated in FIG. 12, in the absence of reforming step S8, the FTIR spectrum is similar to the FTIR spectrum obtained when the substrate temperature was 450° C. This result suggests that when the thermally nitrided SiCN film is not exposed to the hydrogen plasma, the resulting SiCN film is prone to oxidation in open air.

Figure 13:
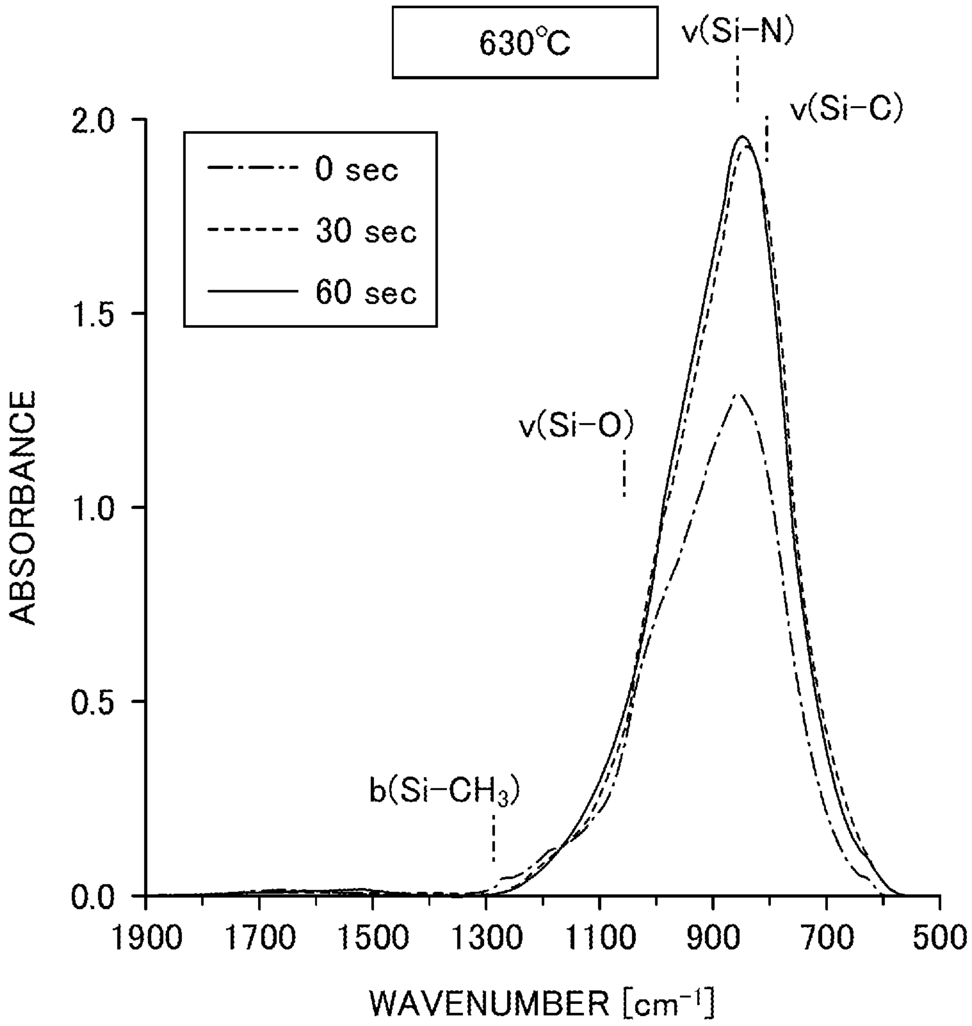
FIG. 13 is a view illustrating the bonding state of the SiCN film.

FIG. 13 is a view illustrating the bonding state of the SiCN film, and illustrates a FTIR spectrum of the SiCN film obtained when the substrate temperature was 630° C. In FIG. 13, the horizontal axis indicates wavenumber [$cm^{-1}$], and the vertical axis indicates absorbance. In FIG. 13, the result obtained when the duration of reforming step S8 was 60 seconds is denoted by a solid line, the result obtained when the duration of reforming step S8 was 30 seconds is denoted by a dashed line, and the result obtained when the duration of reforming step S8 was 0 seconds is denoted by a chain line.

As illustrated in FIG. 13, a peak attributed to the Si—N bond is larger in the presence of reforming step S8 than in the absence of reforming step S8. This result suggests that when the thermally nitrided SiCN film is exposed to the hydrogen plasma, the number of the Si—N bonds increases.

As illustrated in FIG. 13, when the substrate temperature is 630° C., even in the absence of reforming step S8, approximately no peak attributed to the Si—$CH_3$ bond appears, and a peak attributed to the Si—N bond appears. This result suggests that when the substrate temperature is 630° C., reforming step S8 impacts the bonding state of the SiCN film to a smaller extent than when the substrate temperature is 450° C. or 550° C.

According to the present disclosure, it is possible to form a SiCN film that is not prone to oxidation.

It should be understood that the embodiments disclosed herein are illustrative and not restrictive in all respects. Various omissions, substitutions, and changes may be made to the above-described embodiments without departing from the scope of claims recited and the spirit of the disclosure.

The above-described embodiments are related to the batch-type film forming apparatus configured to perform the process to the plurality of substrates all at once, but the present disclosure is not limited thereto. For example, the film forming apparatus may be a single wafer processing apparatus configured to process a plurality of substrates one by one.

What is claimed is:

1. A film forming method, comprising:

a) supplying raw material gas to a substrate, thereby adsorbing the raw material gas to the substrate, the raw material gas having, in a molecule thereof, a cyclic structure including a silicon atom and a carbon atom;

b) thermally treating the substrate in an atmosphere including nitriding gas without supply of a RF power, thereby thermally nitriding the raw material gas adsorbed to the substrate;

b1) supplying inert gas to the substrate to purge the substrate after b); and c) exposing the substrate to a hydrogen plasma after each occurrence of b1), thereby reforming the thermally nitrided raw material gas, wherein a process of performing a), b), b1), and c) in order is repeated a plurality of times, thereby forming a SiCN film.

2. The film forming method according to claim 1, wherein a process of repeating a) and b) in order a plurality of times and subsequently performing c) is repeated a plurality of times.

3. The film forming method according to claim 1, wherein the raw material gas has, in a molecule thereof, a four-membered cyclic structure including a silicon atom and a carbon atom.

4. The film forming method according to claim 2, wherein the raw material gas has, in a molecule thereof, a four-membered cyclic structure including a silicon atom and a carbon atom.

5. The film forming method according to claim 3, wherein the raw material gas is 1,1,3,3-tetrachloro-1,3-disilacyclobutane.

6. The film forming method according to claim 4, wherein the raw material gas is 1,1,3,3-tetrachloro-1,3-disilacyclobutane.

* * * * *